United States Patent
Lo

(10) Patent No.: US 12,404,438 B2
(45) Date of Patent: Sep. 2, 2025

(54) THERMALLY CONDUCTIVE BOARD

(71) Applicant: Polytronics Technology Corp., Hsinchu (TW)

(72) Inventor: Kuo-Chang Lo, New Taipei (TW)

(73) Assignee: TCLAD TECHNOLOGY CORPORATION, Miaoli County (TW)

( * ) Notice: Subject to any disclaimer, the term of this patent is extended or adjusted under 35 U.S.C. 154(b) by 277 days.

(21) Appl. No.: 18/348,001

(22) Filed: Jul. 6, 2023

(65) Prior Publication Data

US 2024/0199936 A1 Jun. 20, 2024

(30) Foreign Application Priority Data

Dec. 15, 2022 (TW) .................................. 111148124

(51) Int. Cl.
| | |
|---|---|
| C09K 5/14 | (2006.01) |
| C08J 5/04 | (2006.01) |
| C08K 3/36 | (2006.01) |
| H05K 1/03 | (2006.01) |
| C08K 3/34 | (2006.01) |

(52) U.S. Cl.
CPC ................. *C09K 5/14* (2013.01); *C08J 5/043* (2013.01); *C08K 3/36* (2013.01); *H05K 1/0373* (2013.01); *C08J 2327/18* (2013.01); *C08J 2327/22* (2013.01); *C08K 2003/343* (2013.01); *C08K 2201/001* (2013.01); *H05K 2201/015* (2013.01); *H05K 2201/0209* (2013.01)

(58) Field of Classification Search
CPC .... C08J 2327/18; C08J 2327/22; C08J 5/043; C08K 2003/343; C08K 2201/001; C08K 3/36; C09K 5/14; H05K 1/0373; H05K 2201/015; H05K 2201/0209
See application file for complete search history.

(56) References Cited

FOREIGN PATENT DOCUMENTS

| | | |
|---|---|---|
| CN | 108440878 A | 8/2018 |
| TW | 201307231 A | 2/2013 |

*Primary Examiner* — Lawrence D Ferguson
(74) *Attorney, Agent, or Firm* — MUNCY, GEISSLER, OLDS & LOWE, P.C.

(57) ABSTRACT

A thermally conductive board includes a top metal foil, a bottom metal foil, and a thermally conductive layer laminated therebetween. The thermally conductive layer includes an electrically insulation matrix and a thermally conductive filler. The electrically insulation matrix includes a fluoropolymer. The thermally conductive filler includes a glass fiber dispersed in the electrically insulation matrix. The glass fiber has a first dielectric constituent and a second dielectric constituent. The first dielectric constituent is a halogen. The total weight of the glass fiber is calculated as 100%, and the halogen accounts for at least 0.05%. The second dielectric constituent is a titanium family element. The total weight of the glass fiber is calculated as 100%, and the titanium family element accounts for at least 0.03%.

16 Claims, 1 Drawing Sheet

THERMALLY CONDUCTIVE BOARD

BACKGROUND OF THE INVENTION

(1) Field of the Invention

The present application relates to a thermally conductive board, and more specifically, to a thermally conductive board having a low dielectric constant.

(2) Description of the Related Art

Typically, a thermally conductive board has a triple-layer structure which consists of a top metal layer, a bottom metal layer, and a thermally conductive layer laminated between the top metal layer and the bottom metal layer. The top metal layer is a copper layer, and a required wiring pattern (i.e., layout) can be obtained through a patterning process performed on the copper layer, thereby forming a wiring layer. The bottom metal layer is often an aluminum plate, which conducts heat from the wiring layer and is helpful to dissipate heat to the surroundings. In order to avoid short circuit, a thermally conductive but electrically insulating material (referred to as "thermally conductive layer" hereinafter for simplification) is further provided between the top metal layer and the bottom metal layer. The thermally conductive layer also needs to be excellent in thermal conduction, and therefore conducts heat to the bottom metal layer.

In recent years, the application of the thermally conductive board may be limited as 5G technology rapidly develops. Besides the thermal conduction, the performance of the thermally conductive board in high-frequency circuits is also taken into consideration, and the characteristic for such performance is determined by the dielectric constant of the thermally conductive layer. However, the dielectric constant of the thermally conductive layer in the conventional thermally conductive board is so high to cause signal propagation delay, which is adverse to high frequency application. More specifically, the thermally conductive layer of the conventional thermally conductive board includes an electrically insulation matrix and a filler; the electrically insulation matrix often consists of polymers; and the filler is dispersed in the electrically insulation matrix and improves the physical/chemical properties of the thermally conductive layer. The filler may include a glass fiber as its main composition, and E-glass fiber is the most common type used in the industry of glass fibers. However, although E-glass fiber is excellent in high-temperature endurance and electrical insulation, its dielectric constant is too high to be suitable for high frequency application.

Obviously, the issue of high dielectric constant exists in the conventional thermally conductive board, and needs to be solved immediately.

SUMMARY OF THE INVENTION

The present invention provides a thermally conductive board, and is aimed to the improvement of a functional filler (i.e., thermally conductive filler) in the thermally conductive layer. The thermally conductive filler includes a glass fiber as its main composition, and a small amount of fluorine and titanium is introduced in the glass fiber. Owing to the adjustment of the element constituents, the thermally conductive layer has a low dielectric constant which makes the thermally conductive board of the present invention suitable to be used in high-frequency circuits.

In accordance with an aspect of the present invention, a thermally conductive board includes a top metal foil, a bottom metal foil, and a thermally conductive layer. The thermally conductive layer is electrically insulative, and laminated between the top metal foil and the bottom metal foil. The thermally conductive layer includes an electrically insulation matrix and a thermally conductive filler. The electrically insulation matrix includes a fluoropolymer. The thermally conductive filler includes a glass fiber dispersed in the electrically insulation matrix. The glass fiber has a first dielectric constituent and a second dielectric constituent. The first dielectric constituent is a halogen, wherein the total weight of the glass fiber is calculated as 100%, and the halogen accounts for at least 0.05% by weight of the glass fiber. The second dielectric constituent is a titanium family element, wherein the total weight of the glass fiber is calculated as 100%, and the titanium family element accounts for at least 0.03% by weight of the glass fiber.

In an embodiment, the halogen is fluorine.

In an embodiment, the titanium family element is titanium.

In an embodiment, the total weight of the glass fiber is calculated as 100%, and the fluorine accounts for 0.05% to 5% by weight of the glass fiber.

In an embodiment, the total weight of the glass fiber is calculated as 100%, and the titanium accounts for 0.03% to 3% by weight of the glass fiber.

In an embodiment, the total volume of the thermally conductive layer is calculated as 100%, and the fluoropolymer accounts for 30% to 40% and the glass fiber accounts for 60% to 70% by volume of the thermally conductive layer.

In an embodiment, the thermally conductive layer has a thickness ranging from 0.05 mm to 0.35 mm, and the glass fiber has a fiber length not more than 50 μm.

In an embodiment, the thermally conductive layer has a dielectric constant ranging from 3.7 to 3.8.

In an embodiment, the thermally conductive filler further includes a silicate-based material. The silicate-based material is selected from the group consisting of boroaluminosilicate, quartz, feldspar, tourmaline, mica, fluorphlogopite mica, kaolinite, titanium silicate, zirconium silicate, hafnium silicate, hollow glass sphere, and any combination thereof.

In an embodiment, the total volume of the thermally conductive layer is calculated as 100%, and the electrically insulation matrix accounts for 50% to 60% and the thermally conductive filler accounts for 40% to 50% by volume of the thermally conductive layer.

In an embodiment, the total volume of the thermally conductive layer is calculated as 100%, and the glass fiber of the thermally conductive filler accounts for 30% to 40% and the silicate-based material of the thermally conductive filler accounts for 10%.

In an embodiment, the thermally conductive layer has a thickness ranging from 0.05 mm to 0.35 mm, and both a fiber length of the glass fiber and a particle diameter of the silicate-based material are not more than 50 μm.

In an embodiment, the thermally conductive layer has a dielectric constant ranging from 3 to 3.3.

In an embodiment, the fluoropolymer is selected from the group consisting of polytetrafluoroethene, perfluoroalkoxy modified tetrafluoroethylenes, tetrafluoroethylene-hexafluoro-propylene copolymer, and any combination thereof.

In an embodiment, the top metal foil and the bottom metal foil are copper foils.

In an embodiment, each copper foil has a thickness ranging from 0.5 oz to 2 oz.

BRIEF DESCRIPTION OF THE DRAWINGS

The present application will be described according to the appended drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
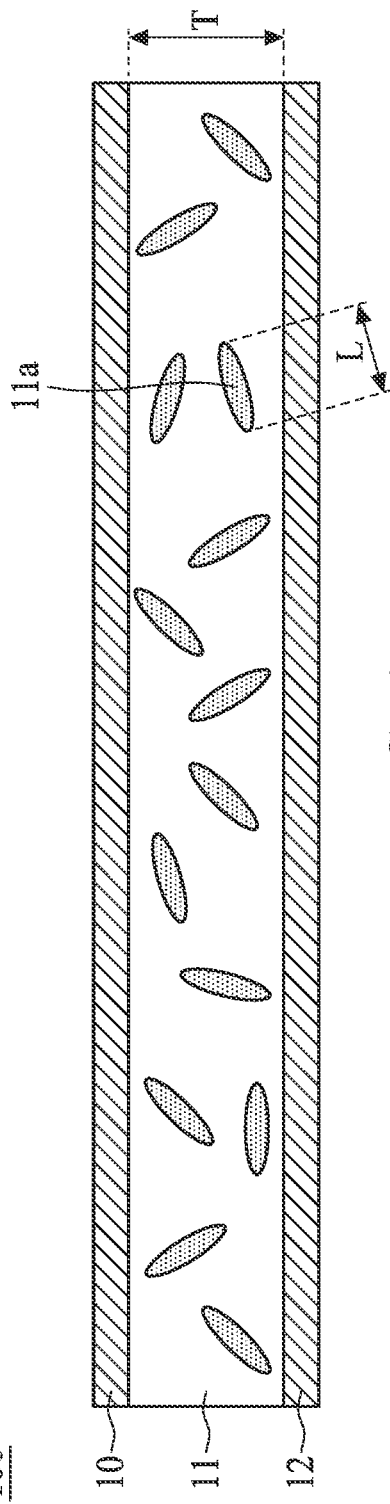
FIG. 1 shows a cross-sectional view of a thermally conductive board in accordance with an embodiment of the present invention.

Please refer to FIG. 1, in which shows an aspect of a thermally conductive board 100 of the present invention. The thermally conductive board 100 includes a top metal foil 10, a bottom metal foil 12, and a thermally conductive layer 11. The thermally conductive layer 11 is electrically insulative, and laminated between the top metal foil 10 and the bottom metal foil 12. In an embodiment, the top metal foil 10 and the bottom metal foil 12 may be metal layers containing copper, or the top metal foil 10 and the bottom metal foil 12 may be metal layers containing other metals or any alloy. Each metal layer has a thickness ranging from 0.5 ounce (oz) to 2 oz. The top metal foil 10, the bottom metal foil 12, and the thermally conductive layer 11 may form a triple-layer structure of the thermally conductive board 100 by hot pressing. Because of the thermally conductive layer 11, the top metal foil 10 is electrically isolated from the bottom metal foil 12. Subsequently, the top metal foil 10 and/or the bottom metal foil 12 can be processed to form the wiring layers to be assembled with various electronic components. Besides the wiring layers, the thermally conductive layer 11 is excellent in heat conduction, and therefore heat produced from the electronic components can be effectively transferred from the thermally conductive layer 11 to any metal layer for heat dissipation. The thermally conductive layer 11 includes an electrically insulation matrix and a thermally conductive filler. The electrically insulation matrix includes a fluoropolymer. In an embodiment, the fluoropolymer is selected from the group consisting of polytetrafluoroethene, perfluoroalkoxy modified tetrafluoroethylenes, tetrafluoroethylene-hexafluoro-propylene copolymer, and any combination thereof. The thermally conductive filler includes a glass fiber 11a dispersed in the electrically insulation matrix. As shown in FIG. 1, a plurality of the glass fibers 11a is the thermally conductive filler of the thermally conductive layer 11, and the region excluding the plurality of the glass fibers 11a is the electrically insulation matrix. It is understood that the aforementioned glass fiber 11a is intended to be illustrative only, and either the number or the shape of it is not limited thereto. In addition, the region excluding the plurality of the glass fibers 11a may further be filled with other thermally conductive fillers.

It is noted that the glass fiber 11a of the present invention has two elements, each of which has a given ratio, allowing the thermally conductive layer 11 to lower its dielectric constant. More specifically, the glass fiber 11a has a first dielectric constituent and a second dielectric constituent. The first dielectric constituent is a halogen, such as fluorine (F), chlorine (Cl), bromine (Br), iodine (I) or astatine (At). The total weight of the glass fiber 11a is calculated as 100%, and the halogen accounts for at least 0.05% by weight of the glass fiber 11a. The second dielectric constituent is a titanium family element, such as titanium (Ti), zirconium (Zr), hafnium (Hf) or rutherfordium (Rf). The total weight of the glass fiber 11a is calculated as 100%, and the titanium family element accounts for at least 0.03% by weight of the glass fiber 11a. It is understood that the aforementioned titanium family element is a transition metal, and refers to any Group 4 (IVB) element listed on the periodic table of chemical elements.

For example, the first dielectric constituent is fluorine, and the second dielectric constituent is titanium. If the total weight of the glass fiber 11a is calculated as 100%, the fluorine accounts for 0.05% to 5% and the titanium accounts for 0.03% to 3% by weight of the glass fiber 11a. It is noted that only a trace amount of either fluorine or titanium is needed to effectively lower the dielectric constant of the thermally conductive layer 11. Otherwise, a large amount of fluorine or titanium may raise the dielectric constant of the thermally conductive layer 11. Besides the disadvantage of increasing dielectric constant described above, there are other issues if the glass fiber 11a contains excessive fluorine or titanium. If fluorine exists in a large amount, it suggests excessive use of fluorine-containing organic solvents in the manufacturing process. These fluorine-containing organic solvents are not eco-friendly while being harmful to human health. If titanium exists in a large amount, a number of elements may react with titanium to form minerals (e.g., perovskite) having high dielectric constant during the high temperature process. The aforementioned elements include carbon (C), oxygen (O), magnesium (Mg), aluminum (Al), silicon (Si) and calcium (Ca). The perovskite may be calcium titanate ($CaTiO_3$). It is noted that calcium titanate has a high dielectric constant ranging from 150 to 190 at a frequency of 10 GHz. Therefore, in a preferred embodiment, the amount of fluorine and the amount of titanium are both adjusted to be lower than the previous range, that is, the fluorine accounts for 0.05% to 1.1% and the titanium accounts for 0.03% to 0.8% by weight of the glass fiber 11a.

In the thermally conductive layer 11, the amount of the glass fiber 11a of the thermally conductive filler accounts for over half the amount of the thermally conductive layer 11 in order to effectively improve the dielectric constant and have excellent thermal conductivity. For example, in the thermally conductive layer 11, the electrically insulation matrix consists of the fluoropolymer and the thermally conductive filler consists of the glass fiber 11a. The total volume of the thermally conductive layer 11 is calculated as 100%, and the fluoropolymer accounts for 30% to 40% and the glass fiber accounts for 60% to 70% by volume of the thermally conductive layer 11. Moreover, the use of a single composition to form the thermally conductive filler is favorable to simplify the formulation design. It is understood that if the thermally conductive filler consists of at least two compositions, compatibility between one composition and the other one composition must be further taken into consideration, and so does the compositions and the electrically insulation matrix. In the time of fast-changing technologies, the formulation is frequently improved on the prior basis.

However, the more compositions the formulation has, the more complex the formulation design is. In the present invention, the dielectric constant of the thermally conductive layer 11 having the thermally conductive filler made of single composition is lower than 3.8, such as 3.7-3.8.

In addition, the thermally conductive layer 11 has a thickness T ranging from 0.05 mm to 0.35 mm, such as 0.05 mm, 0.075 mm, 0.1 mm, 0.125 mm, 0.15 mm, 0.175 mm, 0.2 mm, 0.225 mm, 0.25 mm, 0.275 mm, 0.3 mm, 0.325 mm, or 0.35 mm. In consideration of mechanical properties of the thermally conductive layer 11, a fiber length L of the glass fiber 11a is preferably shorter than a thickness T of the thermally conductive layer 11. For example, the fiber length L of the glass fiber 11a is not more than 50 μm (i.e., 0.05 mm). If the fiber length L of the glass fiber 11a is longer than the thickness T of the thermally conductive layer 11, lots of glass fibers 11a may butt against the top and the bottom surfaces of the thermally conductive layer 11 by their tips. Under this circumstance, the glass fibers 11a are easily broken or may penetrate the top and the bottom surfaces of the thermally conductive layer 11, thereby damaging the original structure of the thermally conductive layer 11. The damaged structure may lead to numerous unfavorable electrical characteristics, such as insufficient voltage endurance to pass the test of HHBT (High Temperature High Humidity Bias Test). Besides, if the fiber length L of the glass fiber 11a is shorter than the thickness T of the thermally conductive layer 11, each glass fiber 11a is not stuck against the top/bottom surfaces of the thermally conductive layer 11 by its tips and therefore the glass fibers 11a can be uniformly dispersed in the thermally conductive layer 11.

Figure 2:
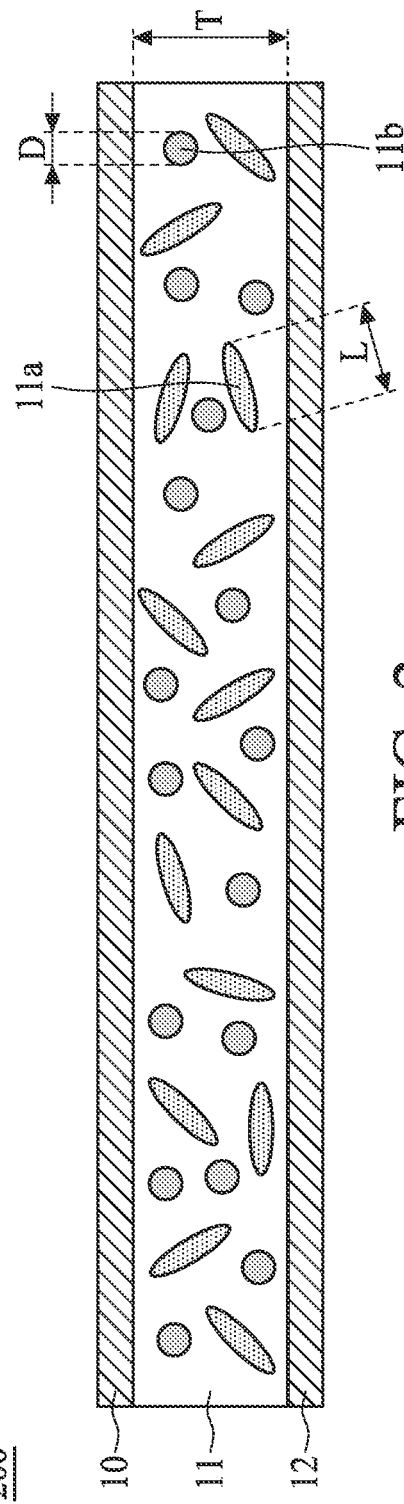
FIG. 2 shows a cross-sectional view of a thermally conductive board in accordance with an alternative embodiment of the present invention.

Please refer to FIG. 2, in which shows another aspect of a thermally conductive board 200 of the present invention. Compared with FIG. 1, the thermally conductive filler of the thermally conductive board 200 includes at least two compositions (i.e., glass fiber 11a and silicate-based material 11b) in FIG. 2. In FIG. 2, the top metal foil 10, the bottom metal foil 12, the thickness T of the thermally conductive layer 11, the electrically insulation matrix of the thermally conductive layer 11, and the glass fiber 11a of the thermally conductive layer 11 are the same as in FIG. 1, and are not described in detail herein.

As described above, the use of a single composition to form the thermally conductive filler is favorable to simplify the formulation design. However, the thermally conductive filler may still contain a plurality of compositions in order to further improve the dielectric constant. In the thermally conductive layer 11 of the thermally conductive board 200, the thermally conductive filler further includes the silicate-based material 11b. The silicate-based material 11b is selected from the group consisting of boroaluminosilicate, quartz, feldspar, tourmaline, mica, fluorphlogopite mica, kaolinite, titanium silicate, zirconium silicate, hafnium silicate, hollow glass sphere, and any combination thereof. Considering compatibility between the thermally conductive filler and the electrically insulation matrix, the proportion of them is adjusted. For example, the total volume of the thermally conductive layer 11 is calculated as 100%, and the electrically insulation matrix accounts for 50% to 60% and the thermally conductive filler accounts for 40% to 50% by volume of the thermally conductive layer 11. Furthermore, the total volume of the thermally conductive layer 11 is calculated as 100%, and the glass fiber 11a of the thermally conductive filler accounts for 30% to 40% and the silicate-based material 11b of the thermally conductive filler accounts for 10%. In an embodiment, the silicate-based material 11b may be replace with another functional filler, such as another glass fiber with low dielectric constant.

Moreover, in the present embodiment, a particle diameter D of the silicate-based material 11b is preferably shorter than 50 μm, the same as the fiber length L of the glass fiber 11a. It is noted that the shape of the silicate-based material 11b may be spheroid, debris, flake, or any irregular shape, although the silicate-based material 11b is illustrated in the shape of sphere in FIG. 2. In this way, the thermally conductive layer 11 may have the thermally conductive filler containing at least two compositions described above, and the dielectric constant of it is lower than 3.3, such as 3-3.3.

In order to verify the performance of the thermally conductive board 100 and the thermally conductive board 200 of the present invention, various tests are conducted and the results are shown in Table 1 to Table 3 below.

TABLE 1

| Element | Glass fiber 1 | | Glass fiber 2 | |
|---|---|---|---|---|
| | Weight proportion (wt %) | Atomic proportion (at %) | Weight proportion (wt %) | Atomic proportion (at %) |
| C | 16.60 | 24.13 | 33.86 | 43.94 |
| O | 51.90 | 56.64 | 45.96 | 44.78 |
| F | — | — | 1.09 | 0.89 |
| Mg | 0.87 | 0.62 | 1.21 | 0.77 |
| Al | 6.49 | 4.20 | 3.51 | 2.03 |
| Si | 20.88 | 12.98 | 12.26 | 6.80 |
| Ca | 3.27 | 1.43 | 1.49 | 0.58 |
| Ti | — | — | 0.63 | 0.21 |

As shown in Table 1, the element content of two glass fibers (glass fiber 1 and glass fiber 2) is analyzed. Glass fiber 1 is the E-glass fiber as conventionally used in the thermally conductive filler, and glass fiber 2 is the improved glass fiber of the present invention. The difference between the glass fiber 1 and the glass fiber 2 is the number of types of elements. Compared with the glass fiber 1, the glass fiber 2 further includes fluorine (F) and titanium (Ti). The total weight of the glass fiber 2 is calculated as 100%, and fluorine (F) and titanium (Ti) account for 1.09% and 0.63%, respectively. It is understood that the proportion of the aforementioned two elements can be adjusted depending on the requirements, and it still has the same technical effect. Fluorine (F) may range from 0.05% to 5%, and titanium (Ti) may range from 0.03% to 3%. However, both fluorine (F) and titanium (Ti) act as the trace elements to adjust the dielectric constant, as described above. Given the same change in percentage, trace elements tend to affect the electrical properties to a greater extent than major elements. In order to have a better repeatability/reproducibility of low dielectric constant, the weight proportion of fluorine (F) preferably ranges from 0.05% to 1.1%, and the weight proportion of titanium (Ti) preferably ranges from 0.03% to 0.8%.

Accordingly, the glass fiber 1 and the glass fiber 2 can be used to formulate different thermally conductive fillers as listed in Table 2 below.

TABLE 2

| Group | Electrically insulation matrix | Thermally conductive filler | | Thickness of thermally conductive layer (mm) | Thickness of each copper foil (oz) |
|---|---|---|---|---|---|
| | | Glass fiber | Silicate-based material | | |
| E1 | 35% PTFE | 65% Glass fiber 2 | | 0.075 | 1 |
| E2 | 35% PTFE | 65% Glass fiber 2 | | 0.175 | 2 |
| E3 | 35% PTFE | 65% Glass fiber 2 | | 0.300 | 2 |
| E4 | 50% PFA | 40% Glass fiber 2 | 10% SiO$_2$ | 0.075 | 1 |
| E5 | 60% PTFE | 30% Glass fiber 2 | 10% Mica | 0.300 | 0.5 |
| C1 | 35% PTFE | 65% Glass fiber 1 | | 0.075 | 1 |
| C2 | 35% PTFE | 65% Glass fiber 1 | | 0.175 | 2 |
| C3 | 35% PTFE | 65% Glass fiber 1 | | 0.300 | 2 |
| C4 | 50% PFA | 40% Glass fiber 1 | 10% SiO$_2$ | 0.075 | 1 |
| C5 | 60% PTFE | 30% Glass fiber 1 | 10% Mica | 0.300 | 0.5 |

As shown in Table 2, groups E1 to E5 represent embodiments of the present invention, and groups C1 to C5 represent comparative examples. The thermally conductive layer 11 consists of the electrically insulation matrix and the thermally conductive filler, and the proportion between them is expressed by volume percentage. In the embodiments E1 to E3, the electrically insulation matrix consists of polytetrafluoroethylene (PTFE), and the thermally conductive filler only contains the glass fiber 2. Moreover, in order to verify that the present invention can be used in different thicknesses and can have the same technical effect in the thermally conductive layer 11, the thickness ranges from 0.075 mm to 0.3 mm.

In the embodiments E4 to E5, the thermally conductive filler further includes another material, that is, the silicate-based material. The silicate-based material in the embodiment E4 is silicon dioxide (SiO$_2$), and the silicate-based material in the embodiment E5 is mica. The silicate-based material constitutes the minor part of the thermally conductive filler, and can fine-tune the dielectric property of the thermally conductive layer 11. It is noted that the electrically insulation matrix in the embodiment E4 changes, that is, PTFE is replaced with another fluoropolymer, perfluoroalkoxy modified tetrafluoroethylene (PFA). Owing to the different composition of the thermally conductive filler, the proportion of the electrically insulation matrix can be adjusted in the range from 50% to 60%.

The combination of the electrically insulation matrix and the thermally conductive filler in the comparative examples C1 to C5 corresponds to that in the embodiments E1 to E5, and the only difference is the type of glass fiber. According to the composition in Table 2, the embodiments E1 to E5 and the comparative examples C1 to C5 are manufactured by the same method including three steps. The steps are mixing step, sheet-forming step, and pressing step.

In the mixing step, the fluoropolymer-containing emulsion and the thermally conductive filler are mixed with water for 60 minutes to form a thermally conductive slurry.

In the sheet-forming step, the thermally conductive slurry is baked and pressed into sheets. More specifically, the thermally conductive slurry is placed under an environment at 110° C. and baked for 24 hours, and the soy wax is added for lubrication. Then, the baked thermally conductive slurry can be pressed into sheets by the extrusion process at 100° C., and the sheets are washed with cyclohexanone. The extrusion process may be replaced with other processes such as calendaring process. It is noted that the thermally conductive filler of the present invention is excellent in dispersion and easily molded, and therefore the operation temperature in this step can be lowered down to 40° C.-80° C.

In the pressing step, each sheet is laminated between two copper foils to form the thermally conductive board. More specifically, one copper foil is placed on the top surface of the sheet, and the other one is placed on the bottom surface of the sheet, thereby forming a stacking structure. Then, the stacking structure is hot pressed at 380° C. for 50 minutes and cooled down under room temperature. After hot pressing, the stacking structure can be diced into small pieces, that is, a plurality of the thermally conductive boards. The following measurements of dielectric constant (at 10 GHz) and thermal conductivity are performed by taking fifteen thermally conductive boards as samples to be tested for each of the groups. In each measurement, the mean value of a set of 15 data is calculated, and the result is listed in Table 3 below.

TABLE 3

| Group | E1 | E2 | E3 | E4 | E5 | C1 | C2 | C3 | C4 | C5 |
|---|---|---|---|---|---|---|---|---|---|---|
| Dielectric constant (Dk) | 3.8 | 3.7 | 3.8 | 3.3 | 3.0 | 5.1 | 5.1 | 5.0 | 4.1 | 3.6 |
| Thermal conductivity (W/mK) | 0.6 | 0.5 | 0.5 | 0.3 | 0.2 | 0.5 | 0.5 | 0.5 | 0.3 | 0.1 |

The dielectric constant in the embodiments E1 to E3 ranges from 3.7 to 3.8, and the dielectric constant in the comparative examples C1 to C3 ranges from 5 to 5.1. The thermally conductive fillers of the aforementioned embodiments and comparative examples are made of a single type of glass fiber, and it suggests that the dielectric constant can be effectively lowered from 5 to less than 4 as long as the conventional glass fiber 1 is replaced with the glass fiber 2 of the present invention. In addition, the dielectric constants of the embodiments E1 and E3 are similar, even though the thicknesses of their thermally conductive layers 11 are different. In other words, the present invention can apply to either a thin or a thick thermally conductive layer 11. Moreover, in the embodiments E1 to E3 and the comparative examples C1 to C3, the thermal conductivity is substantially constant, which means that change of the thermally conductive filler of the present invention do not compromise the thermal conductivity. In fact, the thermal conductivity is even better in the embodiment E1. The thermal conductivity in the embodiment E1 is 0.6 W/mK, and the thermal conductivity in the comparative example C1 is 0.5 W/mK. From the above, the embodiment E1 not only has a lower dielectric constant, but also is excellent in thermal conduction.

The dielectric constant in the embodiments E4 to E5 ranges from 3 to 3.3, and the dielectric constant in the comparative examples C1 to C3 ranges from 3.6 to 4.1. In each of the aforementioned embodiments and comparative examples, the thermally conductive filler further includes the silicate-based material. As the result shown above, the combination of the glass fiber and the silicate-based material can further lower the dielectric constant of the thermally conductive layer 11. The combination of the glass fiber 2 and silicon dioxide ($SiO_2$)/mica is better than the combination of the glass fiber 1 and silicon dioxide ($SiO_2$)/mica. In addition, in the embodiment E4, the dielectric constant of the thermally conductive layer 11 still remains lower even though the fluoropolymer in the electrically insulation matrix changes to PFA. It means that the technical effect is substantially the same although another fluoropolymer is used in the present invention. Likewise, under the circumstance of different thicknesses of thermally conductive layer 11, the dielectric constants of the embodiments E4 and E5 are similar. The combination of the thermally conductive filler described above can apply to either a thin or a thick thermally conductive layer 11. In the embodiments E4 to E5 and the comparative examples C4 to C5, the thermal conductivity is substantially constant, which means that change of the thermally conductive filler of the present invention do not compromise the thermal conductivity.

From the above, the present invention improves the glass fiber-based thermally conductive filler of the conventional thermally conductive board, and provides a thermally conductive board with low dielectric constant. In the thermally conductive filler of the present invention, a small amount of fluorine and titanium is introduced in the glass fiber. Owing to the adjustment of the element constituents, the thermally conductive layer has a low dielectric constant which makes the thermally conductive board of the present invention suitable to be used in high-frequency circuits.

The above-described embodiments of the present invention are intended to be illustrative only. Numerous alternative embodiments may be devised by persons skilled in the art without departing from the scope of the following claims.

What is claimed is:

1. A thermally conductive board, comprising:
   a top metal foil;
   a bottom metal foil; and
   a thermally conductive layer being electrically insulative, and laminated between the top metal foil and the bottom metal foil, wherein the thermally conductive layer comprises:
   an electrically insulation matrix comprising a fluoropolymer; and
   a thermally conductive filler comprising a glass fiber dispersed in the electrically insulation matrix, wherein the glass fiber has:
   a first dielectric constituent being a halogen, wherein the total weight of the glass fiber is calculated as 100%, and the halogen accounts for at least 0.05% by weight of the glass fiber; and
   a second dielectric constituent being a titanium family element, wherein the total weight of the glass fiber is calculated as 100%, and the titanium family element accounts for at least 0.03% by weight of the glass fiber.

2. The thermally conductive board of claim 1, wherein the halogen is fluorine.

3. The thermally conductive board of claim 2, wherein the titanium family element is titanium.

4. The thermally conductive board of claim 3, wherein the total weight of the glass fiber is calculated as 100%, and the fluorine accounts for 0.05% to 5% by weight of the glass fiber.

5. The thermally conductive board of claim 4, wherein the total weight of the glass fiber is calculated as 100%, and the titanium accounts for 0.03% to 3% by weight of the glass fiber.

6. The thermally conductive board of claim 5, wherein the total volume of the thermally conductive layer is calculated as 100%, and the fluoropolymer accounts for 30% to 40% and the glass fiber accounts for 60% to 70% by volume of the thermally conductive layer.

7. The thermally conductive board of claim 6, wherein the thermally conductive layer has a thickness ranging from 0.05 mm to 0.35 mm, and the glass fiber has a fiber length not more than 50 μm.

8. The thermally conductive board of claim 7, wherein the thermally conductive layer has a dielectric constant ranging from 3.7 to 3.8.

9. The thermally conductive board of claim 5, wherein the thermally conductive filler further comprises a silicate-based material selected from the group consisting of boroaluminosilicate, quartz, feldspar, tourmaline, mica, fluorphlogopite mica, kaolinite, titanium silicate, zirconium silicate, hafnium silicate, hollow glass sphere, and any combination thereof.

10. The thermally conductive board of claim 9, wherein the total volume of the thermally conductive layer is calculated as 100%, and the electrically insulation matrix accounts for 50% to 60% and the thermally conductive filler accounts for 40% to 50% by volume of the thermally conductive layer.

11. The thermally conductive board of claim 10, wherein the total volume of the thermally conductive layer is calculated as 100%, and the glass fiber of the thermally conductive filler accounts for 30% to 40% and the silicate-based material of the thermally conductive filler accounts for 10%.

12. The thermally conductive board of claim 11, wherein the thermally conductive layer has a thickness ranging from 0.05 mm to 0.35 mm, and both a fiber length of the glass fiber and a particle diameter of the silicate-based material are not more than 50 μm.

13. The thermally conductive board of claim 12, wherein the thermally conductive layer has a dielectric constant ranging from 3 to 3.3.

14. The thermally conductive board of claim 1, wherein the fluoropolymer is selected from the group consisting of polytetrafluoroethene, perfluoroalkoxy modified tetrafluoroethylenes, tetrafluoroethylene-hexafluoro-propylene copolymer, and any combination thereof.

15. The thermally conductive board of claim 1, wherein the top metal foil and the bottom metal foil are copper foils.

16. The thermally conductive board of claim 15, wherein each copper foil has a thickness ranging from 0.5 oz to 2 oz.

* * * * *